(12) United States Patent
Zhang et al.

(10) Patent No.: US 8,782,486 B2
(45) Date of Patent: Jul. 15, 2014

(54) SYSTEMS AND METHODS FOR MULTI-MATRIX DATA PROCESSING

(75) Inventors: Fan Zhang, Milpitas, CA (US); Zongwang Li, San Jose, CA (US); Yang Han, Sunnyvale, CA (US); Shaohua Yang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 10 days.

(21) Appl. No.: 13/412,520

(22) Filed: Mar. 5, 2012

(65) Prior Publication Data

US 2013/0232390 A1    Sep. 5, 2013

(51) Int. Cl.
| | |
|---|---|
| *H03M 13/11* | (2006.01) |
| *H03M 13/09* | (2006.01) |
| *H03M 13/53* | (2006.01) |
| *G11B 20/18* | (2006.01) |

(52) U.S. Cl.
CPC ........... *H03M 13/09* (2013.01); *G11B 20/1833* (2013.01)
USPC .......................................... 714/758; 714/804

(58) Field of Classification Search
CPC ... H03M 13/09; H03M 13/116; H03M 13/41; H04L 1/0061; H04L 1/0057; H04L 1/0045; H04L 1/006; G11B 20/18; G11B 20/1833; G06F 11/1076; G06F 11/1008
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccallister | |

(Continued)

OTHER PUBLICATIONS

Casado et al., Multiple-rate low- density parity-check codes with constant blocklength, IEEE Transations on communications, Jan. 2009, vol. 57, pp. 75-83.

(Continued)

*Primary Examiner* — Ajay Bhatia
*Assistant Examiner* — Dipakkumar Gandhi
(74) *Attorney, Agent, or Firm* — Hamilton DeSanctis & Cha

(57) ABSTRACT

The present inventions are related to systems and methods for data processing. As one example, a data processing system is discussed that includes a data decoder circuit and a matrix select control circuit. The data decoder circuit is operable to apply a data decode algorithm to a decoder input using a selected parity check matrix to yield a decoder output. The matrix select control circuit operable to select one of a first parity check matrix and a second parity check matrix as the selected parity check matrix.

19 Claims, 5 Drawing Sheets

(56) References Cited

U.S. PATENT DOCUMENTS

| | | | |
|---|---|---|---|
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Casado |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2004/0194007 | A1* | 9/2004 | Hocevar ............ 714/801 |
| 2005/0243456 | A1* | 11/2005 | Mitchell et al. ........ 360/46 |
| 2008/0037676 | A1* | 2/2008 | Kyung et al. ........ 375/265 |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2010/0322048 | A1* | 12/2010 | Yang et al. ........ 369/47.15 |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2Λm) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/284,730, Unpublished (filed Oct. 28, 2011) (Fan Zhang).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/227,544, Unpublished (filed Sep. 8, 2011) (Shaohua Yang).

U.S. Appl. No. 13/239,683, Unpublished (filed Sep. 22, 2011) (Changyou Xu).

U.S. Appl. No. 13/186,234, Unpublished (filed Jul. 19, 2011) (Haitao Xia).

U.S. Appl. No. 13/213,751, Unpublished (filed Aug. 19, 2011) (Fan Zhang).

U.S. Appl. No. 13/180,495, Unpublished (filed Jul. 11, 2011) (Chung-Li Wang).

U.S. Appl. No. 13/340,951, Unpublished (filed Dec. 30, 2011) (Lei Chen).

U.S. Appl. No. 13/300,078, Unpublished (filed Nov. 18, 2011) (Chung-Li Wang).

U.S. Appl. No. 13/302,119, Unpublished (filed Nov. 22, 2011) (Lei Chen).

(56) References Cited

OTHER PUBLICATIONS

U.S. Appl. No. 13/305,510, Unpublished (filed Nov. 28, 2011) (Lei Chen).
U.S. Appl. No. 13/227,416, Unpublished (filed Sep. 7, 2011) (Lei Chen).
U.S. Appl. No. 13/305,551, Unpublished (filed Nov. 28, 2011) (Yang Han).
U.S. Appl. No. 13/296,022, Unpublished (filed Nov. 14, 2011) (Victor Krachkovsky).
U.S. Appl. No. 13/174,537, Unpublished (filed Jun. 30, 2011) (Anantha Raman Krishnan).
U.S. Appl. No. 13/174,453, Unpublished (filed Jun. 30, 2011) (Johnson Yen).
U.S. Appl. No. 13/283,549, Unpublished (filed Oct. 27, 2011) (Wu Chang).
U.S. Appl. No. 13/113,219, Unpublished (filed May 23, 2011) (Yang Han).
U.S. Appl. No. 13/340,974, Unpublished (filed Dec. 30, 2011) (Dan Liu).
U.S. Appl. No. 13/327,279, Unpublished (filed Dec. 15, 2011) (Wei Feng).
U.S. Appl. No. 13/316,741, Unpublished (filed Dec. 12, 2011) (Yang Han).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/372,580, Unpublished (filed Feb. 14, 2012) (Fan Zhang).
U.S. Appl. No. 13/171,615, Unpublished (filed Jun. 29, 2011) (Bradley D. Seago).
U.S. Appl. No. 13/369,468, Unpublished (filed Feb. 9, 2012) (Zongwang Li).
U.S. Appl. No. 13/269,852, Unpublished (filed Oct. 10, 2011) (Haitao Xia).
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 08/99.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR MULTI-MATRIX DATA PROCESSING

BACKGROUND OF THE INVENTION

The present inventions are related to systems and methods for data processing, and more particularly to systems and methods for parity matrix based data decoding.

Various data transfer systems have been developed including storage systems, cellular telephone systems, radio transmission systems that utilize data processing circuits. The data processing circuit may include, for example, a low density parity check decoder circuit that is operable to decode data sets that were previously encoded using a parity matrix. When the decoding process is applied a parity matrix is used to guide the decoding process. Considerable effort is expended trying to develop a parity matrix that works across a broad range of conditions. However, in each case, there are tradeoffs between, for example, waterfall performance and error floor performance which result in problematic operational characteristics across a broad range of environments.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for parity matrix based data decoding.

Various embodiments of the present invention provide data processing systems. The data processing systems include a data decoder circuit and a matrix select control circuit. The data decoder circuit is operable to apply a data decode algorithm to a decoder input using a selected parity check matrix to yield a decoder output. The matrix select control circuit operable to select one of a first parity check matrix and a second parity check matrix as the selected parity check matrix. In some cases, the data decoder circuit is a low density parity check decoder circuit.

In some instances of the aforementioned embodiments, the data decoder circuit is operable to repeat application of the data decode algorithm to the decoder input over a number of local iterations. In such instances, selection of the selected parity check by the matrix select control circuit is based at least in part on the number of local iterations. In some cases, during a first local iteration the first parity check matrix is selected, and during a second local iteration the matrix select control circuit selects the second parity check matrix as the selected parity check matrix. In one particular case, the data decoder output includes at least one unsatisfied check and at least one satisfied check. The decoder output corresponding to the at least one unsatisfied check is erased and the decoder output corresponding to the at least one unsatisfied check is used to guide a subsequent local iteration of the data decode algorithm.

In various instances of the aforementioned embodiments, the data processing system further includes a data detector circuit that is operable to apply a data detection algorithm to a data input to yield a detected output. In such instances, the decoder input is derived from the detected output, and processing through both the data detector circuit and the data decoder circuit is repeatable over a number of global iterations. In some cases, selection of the selected parity check by the matrix select control circuit is based at least in part on the number of global iterations. In various cases, the data decoder output includes at least one unsatisfied check and at least one satisfied check. The decoder output corresponding to the at least one unsatisfied check is erased and the decoder output corresponding to the at least one unsatisfied check is used to guide a subsequent global iteration of the data decode algorithm.

Other embodiments of the present invention provide methods for data processing, the method including: providing a data decoder circuit; selecting a first parity check matrix as a selected parity check matrix; applying a data decode algorithm by the data decoder circuit to a decoder input using the selected parity check matrix to yield a first decoder output; determining that the decoder output has at least one unsatisfied check; selecting a second parity check matrix as the selected parity check matrix based at least in part on the determination that the decoder output has at least one unsatisfied check; and reapplying the data decode algorithm by the data decoder circuit to the decoder input using the selected parity check matrix to yield a second decoder output. In some cases, a portion of the first decoded output is used to guide application of the data decode algorithm to yield the second decoder output. In various cases, the first decoded output includes at least one unsatisfied check and at least one satisfied check, and wherein the portion of the first decoded output includes the at least one satisfied check and excludes the at least one unsatisfied check.

In particular instances of the aforementioned embodiments, the methods further include: providing a data detector circuit; and applying a data detection algorithm by the data detector circuit to a data input to yield a detected output. The decoder input is derived from the detected output, and processing the data input through both the data detector circuit and the data decoder circuit is repeated for a number of global iterations. Selecting the second parity check matrix as the selected parity check matrix is based at least in part on the number of global iterations. In some cases, the first decoded output includes at least one unsatisfied check and at least one satisfied check, and wherein the portion of the first decoded output includes the at least one satisfied check and excludes the at least one unsatisfied check.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for parity matrix based data decoding.

Various embodiments of the present invention provide for data decoding across multiple parity check matrices. As an example, a variable data processing system includes a data detector circuit and a data decoder circuit. In the circuit, a processing codeword may be processed through both the data detector circuit and the data decoder circuit across multiple passes or global iterations. During each global iteration, the output of the data detector circuit may pass multiple times through the data decoder circuit. Each pass through the data decoder circuit is referred to as a local iteration. In some embodiments of the present invention, a different parity matrix is used on each global iteration, or after a defined number of global iterations that did not result in convergence of the processing codeword. In other embodiments of the present invention, a different parity matrix is used on each local iteration, or after a defined number of local iterations that did not result in convergence of the processing codeword. In yet another embodiment of the present invention, a default parity matrix is used during an initial number of global iterations that fail to converge. After the failure to converge is noted, one or more alternative parity matrices are used to reprocess the original data. Such reprocessing is done when standard processing fails and is referred to herein as retry processing or offline processing.

Figure 1:
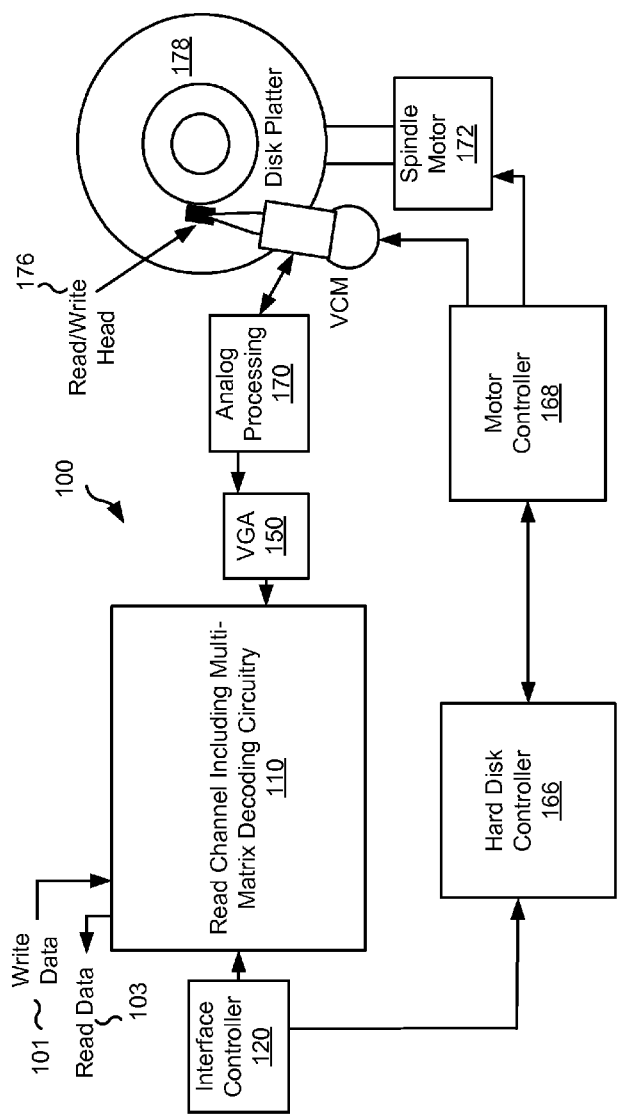
FIG. 1 shows a storage system including multi-matrix decoding circuitry is shown in accordance with various embodiments of the present invention.

Turning to FIG. 1, a storage system 100 including a read channel circuit 110 including multi-matrix decoding circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data processing circuit that includes a data detector circuit and a data decoder circuit. The data decoder circuit initial relies on a default parity matrix to guide processing. When a defined number of global iterations have completed on a processing codeword without complete success, or a defined number of local iterations have completed on the processing codeword without complete success, an alternative parity matrix is selected in place of the default parity matrix to guide processing. Use of such an alternative parity matrix may result in, for example, disruption of a trapping set that developed in relation to the default parity matrix. Where the alternative parity matrix does not result in convergence, yet another parity matrix may be used. The data processing circuit may be implemented similar to that discussed below in relation to FIG. 4, and/or may operate using an approach similar to that discussed below in relation to FIGS. 5a-5c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

The data decoder circuit may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
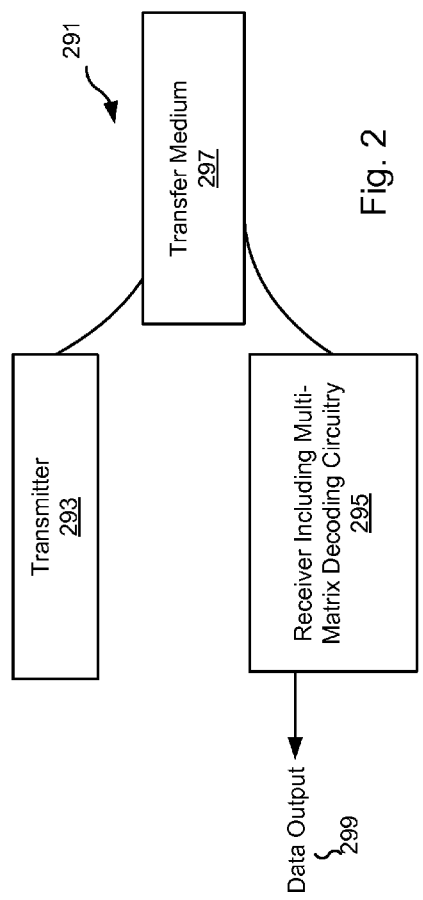
FIG. 2 depicts a data transmission system including multi-matrix decoding circuitry in accordance with one or more embodiments of the present invention.

Turning to FIG. 2, a data transmission system 291 including a receiver 295 having multi-matrix decoding circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. Receiver 295 provides the processed data as a data output 299 to a host (not shown).

Figure 3:
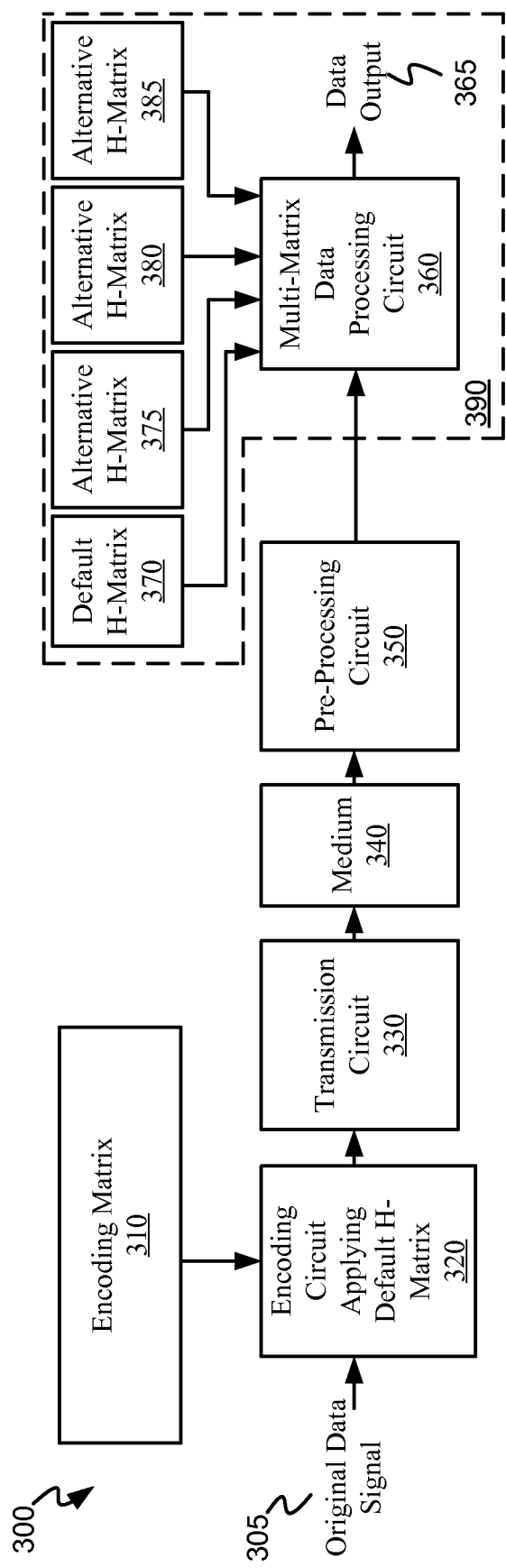
FIG. 3 shows a data transfer system including both encoding circuitry and a multi-matrix data processing circuitry in accordance with some embodiments of the present invention.

The encoding of transmitter 293 and the decoding of receiver 295 may be done using a circuit implemented similar to that discussed in relation to FIG. 3. As part of processing the received information, receiver 295 utilizes a data processing circuit that includes a data detector circuit and a data decoder circuit. The data decoder circuit initial relies on a default parity matrix to guide processing. When a defined number of global iterations have completed on a processing codeword without complete success, or a defined number of local iterations have completed on the processing codeword without complete success, an alternative parity matrix is selected in place of the default parity matrix to guide processing. Use of such an alternative parity matrix may result in, for example, disruption of a trapping set that developed in relation to the default parity matrix. Where the alternative parity matrix does not result in convergence, yet another parity matrix may be used. The data processing circuit may be implemented similar to that discussed below in relation to FIG. 4, and/or may operate using an approach similar to that discussed below in relation to FIGS. 5a-5c. Again, the data decoder circuit may be, but is not limited to, a low density parity check decoder circuit as are known in the art.

FIG. 3 shows a data transfer system 300 including both encoding circuitry and a multi-matrix data processing circuit in accordance with some embodiments of the present invention. As shown, data transfer system 300 includes an encoding circuit 320 that applies a parity check matrix to an original data signal 305. Original data signal 305 may be any set of input data. For example, where data transfer system 300 is a hard disk drive, original data signal 305 may be a data set that is destined for storage on a storage medium. In such cases, a medium 340 of data transfer system 300 is a storage medium such as a hard disk or a solid state medium. As another example, where data transfer system 300 is a communication system, original data signal 305 may be a data set that is destined to be transferred to a receiver via a transfer medium. Such transfer mediums may be, but are not limited to, wired or wireless transfer mediums. In such cases, a medium 340 of data transfer system 300 is a transfer medium or a communication medium. The parity check matrix is represented as an encoding matrix 310 that may be a quasi-cyclic parity check matrix based upon various input constraints. The encoding matrix may be generated using any generation process known in the art. For example, the parity matrix may be generated using a process similar to that described in U.S. patent application Ser. No. 13/316,858 entitled "Systems and Methods for Multi-Level Quasi-Cyclic Low Density Parity Check Codes", and filed Dec. 12, 2011 by Li et al. The entirety of the aforementioned patent application is incorporated herein by reference for all purposes. Based upon the disclosure provided herein, one of ordinary skill in the art will recognize a variety of approaches that may be used to generate parity matrices that may be used in relation to different embodiments of the present invention. In some cases, the encoding applied by encoding circuit 320 is low density parity check encoding constrained by the generated parity check matrix as is known in the art.

Encoding circuit 320 provides a codeword (i.e., original input encoded using the parity check matrix) to a transmission circuit 330. Transmission circuit 330 may be any circuit known in the art that is capable of transferring the received codeword via medium 340. Thus, for example, where data transfer system 300 is part of a hard disk drive, transmission circuit 330 may include a read/write head assembly that converts an electrical signal into a series of magnetic signals appropriate for writing to a storage medium. Alternatively, where data transfer system 300 is part of a wireless communication system, transmission circuit 330 may include a wireless transmitter that converts an electrical signal into a radio frequency signal appropriate for transmission via a wireless communication medium. Transmission circuit 330 provides a transmission output to medium 340. Medium 340 provides a transmitted input that is the original transmission output from transmission circuit 330 augmented with one or more errors introduced by the transference across medium 340.

Data transfer system 300 includes a pre-processing circuit 350 that applies one or more analog functions to the transmitted input from medium 340. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 350 provides a pre-processed output to a data processing circuit 390. Data processing circuit 390 includes a multi-matrix data processing circuit 360 and a number of decoding parity matrices. As shown, the decoding parity matrices include a default H-matrix 370, and one or more alternative H-matrices 375, 380, 385. The encoding matrix used to generate a low density parity check code is represented by vectors where the null space of the parity check matrix satisfies the following equation:

$$H_{m \times n} \cdot C_n = 0_m,$$

where $H_{m \times n}$ is a quasi-cyclic matrix of size m rows by n columns, $C_n$ is a set containing all of the valid codeword, and $0_m$ nulls. Each of the decoding parity matrices exhibit the same null space, but different local topology of a corresponding Tanner graph. Sid another way, each of the decoding parity matrices is different, but all satisfy the equation:

$$H'_{m \times n} \cdot C_n = 0_m$$

where $H'_{m \times n}$ represents the decoding parity check matrices of size m rows by n columns, and complies with the following equation:

$$H'_{m \times n} = M_{m \times m} \cdot H_{m \times n},$$

where $M_{m \times m}$ is a full rank quasi-cyclic matrix. Thus, to generate different $H'_{m \times n}$, different $M_{m \times m}$ matrices. For i equals on to n, each of $H'_{m \times i}$ are the row transformations of $H_{m \times n}$, they all have the same column index.

In some embodiments of the present invention, multi-matrix data processing circuit 360 includes a low density parity check decoder that is capable of decoding the encoded data incorporating the generated parity check matrix (i.e., encoding parity matrix 310). Multi-matrix data processing circuit 360 processes the output of pre-processing circuit 350 initially using default H-matrix 370. Where the processing relying on default H-matrix 370, multi-matrix data processing circuit 360 automatically select one of the alternative H-matrices 375, 380, 385 to re-process the output of pre-processing circuit 350. The re-processing relies upon the soft data obtained from the initial processing of the output of pre-processing circuit 350 giving an increased likelihood of convergence. Such likelihood may be increased where, for example, default H-matrix 370 exhibits good waterfall characteristics that depend upon degree distribution and connectivity of the nodes in the Tanner graph, but can lead to trapping sets and one of alternative H-matrices 375, 380, 385 exhibits better error floor performance and is able to avoid trapping sets. Multi-matrix data processing circuit 360 may continue cycling through the alternative H-matrices using the results of the preceding processing. Ultimately, the result from multi-matrix data processing circuit 360 is provided as a data output 365. Data processing circuit 390 may be implemented similar to a processing block 401 discussed below in relation to FIG. 4.

Figure 4:
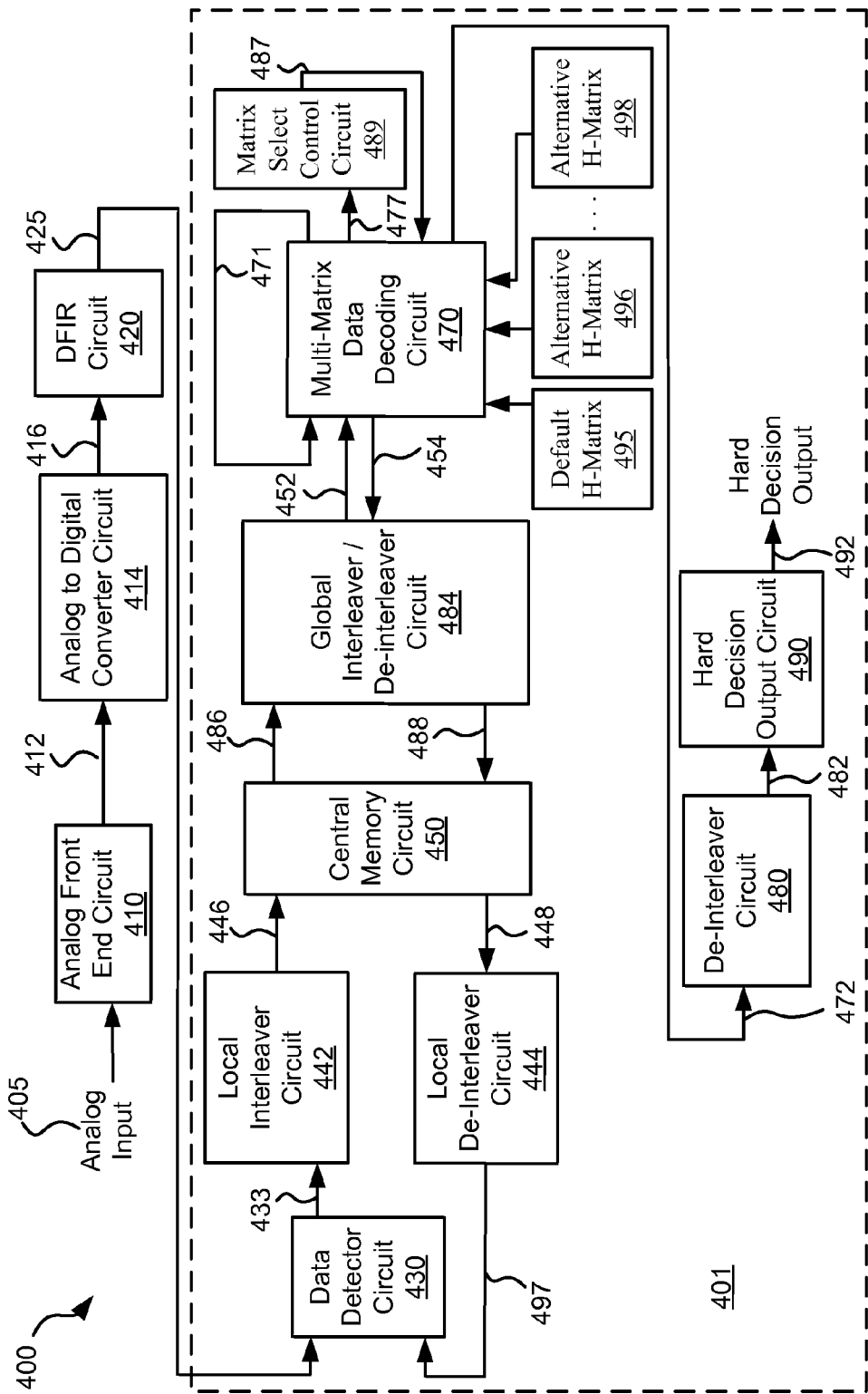
FIG. 4 shows a data processing system including multi-matrix decoding circuitry in accordance with some embodiments of the present invention.

Turning to FIG. 4 shows a data processing system 400 including multi-matrix decoding circuitry in accordance with some embodiments of the present invention. Data processing system 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to and senses data maintained on a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. In some cases, equalizer 420 includes sufficient memory to maintain one or more codewords until processing of that codeword is completed through a data detector circuit 430 and a multi-matrix data decoding circuit 470 including, where warranted, multiple global iterations (passes through both data detector circuit 430 and multi-matrix data decoding circuit 470) and/or local iterations (passes through multi-matrix data decoding circuit 470 during a given global itertation). It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detection circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once a multi-matrix data decoding circuit 470 is available, a previously stored interleaved codeword 446 is accessed from central memory circuit 450 as a stored codeword 486 and globally interleaved by a global interleaver/de-interleaver circuit 484. Global interleaver/De-interleaver circuit 484 may be any circuit known in the art that is capable of globally rearranging codewords. Global interleaver/De-interleaver circuit 484 provides a decoder input 452 into multi-matrix data decoding circuit 470. In some embodiments of the present invention, the data decode algorithm applied by multi-matrix data decoding circuit 470 is a low density parity check algorithm as are known in the art. Based upon the disclosure provided herein, one of ordinary skill in the art will recognize other decode algorithms that may be used in relation to different embodiments of the present invention. Multi-matrix data decoding circuit 470 applies a data decode algorithm to decoder input 452 to yield a decoded output 471. Initially, multi-matrix data decoding circuit 470 uses a default H-matrix 495 to perform the decode algorithm. Default H-matrix 495 may be defined similar to that described above in relation to default H-matrix 370. In cases where another local iteration (i.e., another pass trough multi-matrix data decoding circuit 470) is desired, multi-matrix data decoding circuit 470 re-applies the data decode algorithm to decoder input 452 guided by decoded output 471. This continues until either a maximum number of local iterations as indicated by a local iteration control 431 exceeded or decoded output 471 converges.

Where decoded output 471 fails to converge (i.e., results in no unsatisfied parity checks), and a number of local iterations through multi-matrix data decoding circuit 470 exceeds a threshold, the resulting decoded output is provided as a decoded output 454 back to central memory circuit 450 if a maximum number of global iterations as indicated by a global iteration control 498 has not been exceeded. In this case, decoded output 454 is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output 471 fails to converge and the number of local iterations and the number of global iterations have exceeded their respective limits, an error is generated indicating a failure to converge by multi-matrix data decoding circuit 470. As yet another alternative, where decoded output 471 converges (i.e., there are no remaining unsatisfied parity checks), the resulting decoded output is provided as an output codeword 472 to a de-interleaver circuit 480. De-interleaver circuit 480 rearranges the data to reverse both the global and local interleaving applied to the data to yield a de-interleaved output 482. De-interleaved output 482 is provided to a hard decision output circuit 490. Hard decision output circuit 490 is operable to re-order data sets that may complete out of order back into their original order. The originally ordered data sets are then provided as a hard decision output 492.

Application of the data decode algorithm proceeds through one or more local iterations continues, with the result of each local iteration being provided as a status signal 477 to a matrix select control circuit 489. Based upon status signal 477, matrix select control circuit 489 selects whether to continue using default H-matrix 495 or to select one of alternative H-matrices 496, 498 for a subsequent local or global iteration through multi-matrix data decoding circuit 470. Alternative H-matrices 496, 498 may be defined similar to that described above in relation to alternative H-matrices 375, 380, 385. In some cases, matrix select control circuit 489 selects a different alternative H-matrix on each local iteration that does not converge (i.e., result in no unsatisfied parity checks). In other cases, matrix select control circuit 489 selects a different alternative H-matrix after a defined number of local iterations fail to converge. In yet other cases, matrix select control circuit 489 selects a different alternative H-matrix after each global iteration that fails to converge, or after a defined number of global iterations fail to converge. Based upon the disclosure provided herein, one of ordinary skill in the art will recognize a variety of conditions that may be used to cause a change from default H-matrix 495 to one of the alternative H-matrices 496, 498, or between the alternative H-matrices 496, 498.

The following pseudo-code describes the operation of the combination of multi-matrix data decoding circuit 470 and matrix select control circuit 489:

```
If(First Global Iteration && First Local Iteration){
    Apply the Data Decode Algorithm Using Default H-Matrix 495
}
Else If(Switch Parity Matrix Based Upon Global Iteration){
    If(Global Iteration Failed to Converge
        && Number of Successive Failed Global Iterations ==
        First Threshold){
        Apply the Data Decode Algorithm Using the Next one of
        Alternative H-Matrices 496, 498;
        Reset the Number of Successive Failed Global Iterations
    }
    Else{
        Apply the Data Decode Algorithm Using the Previously Selected
        Parity Matrix;
        Increment the Number of Successive Failed Global Iterations
    }
Else if(Switch Parity Matrix Based Upon Local Iteration){
    If(Local Iteration Failed to Converge
        && Number of Successive Failed Local Iterations ==
        Second Threshold){
        Apply the Data Decode Algorithm Using the Next one of
        Alternative H-Matrices 496, 498;
        Reset the Number of Successive Failed Global Iterations
    }
    Else{
        Apply the Data Decode Algorithm Using the Previously Selected
        Parity Matrix;
        Increment the Number of Successive Failed Local Iterations
    }
```

In some embodiments of the present invention, when there is a change in the parity matrix, only the soft data from decoded output 471 that correspond to satisfied checks are used in subsequent applications of the data decode algorithm, and the other soft data corresponding to unsatisfied checks are erased or zeroed out. As used herein, the phrase "unsatisfied check" is used in its broadest sense to mean a failure of the data decode algorithm in relation to a given symbol. Thus, for example, an unsatisfied check may be a failure of a parity equation calculated by the data decoder circuit. In contrast, as used herein, the phrase "satisfied check" is used in its broadest sense to mean a success of the data decode algorithm in relation to a given symbol. Thus, for example, a satisfied check may be a success of a parity equation calculated by the data decoder circuit.

Figure 5A:
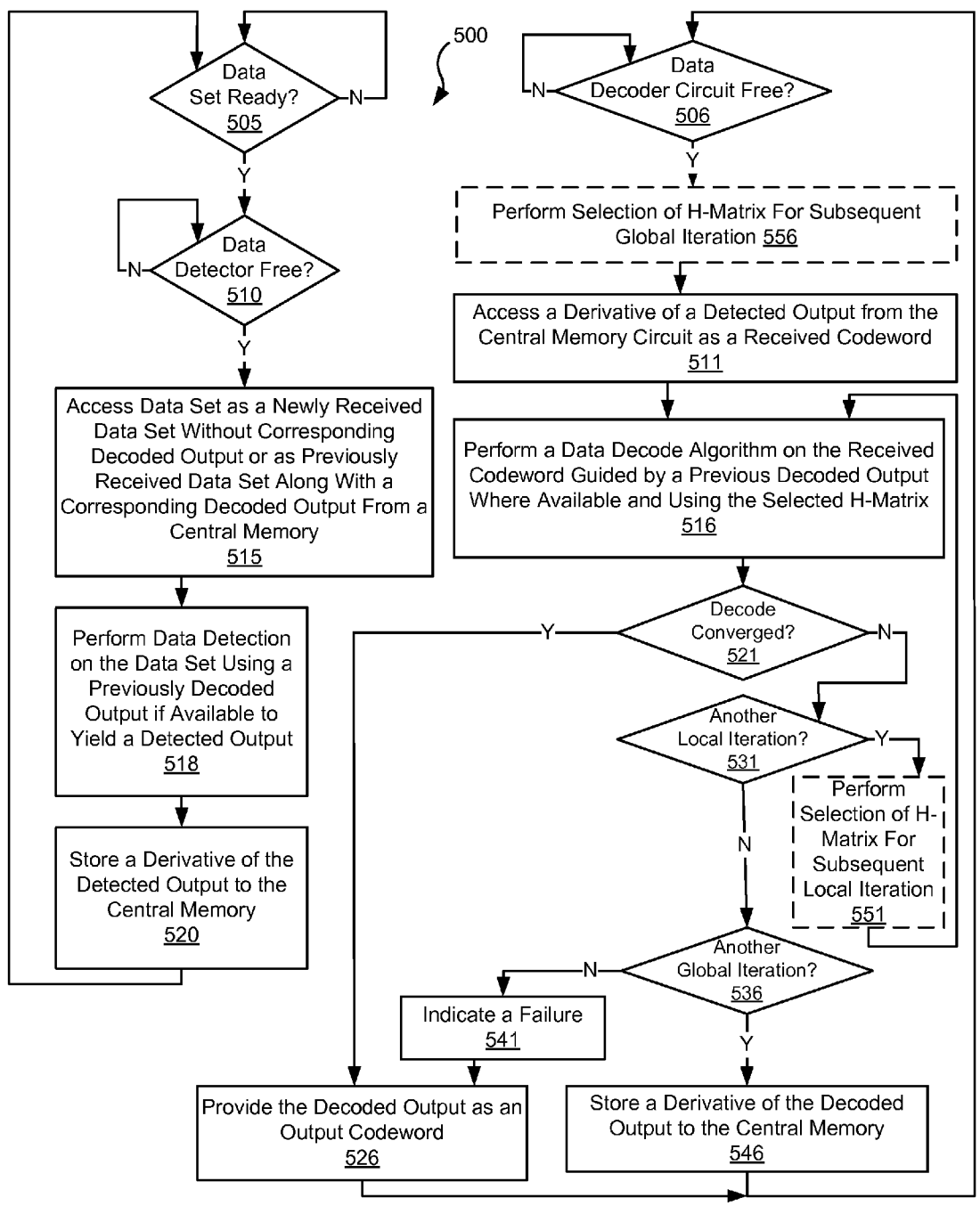
FIG. 5a is a flow diagram showing a method for variable data processing through data decoder and data detection circuitry.

Turning to FIG. 5a, a flow diagram 500 shows a process for variable data processing through a data detector circuit and a data decoder circuit. Following flow diagram 500, it is determined whether a data set is ready for application of a data detection algorithm (block 505). In some cases, a data set is ready when it is received from a data decoder circuit via a central memory circuit. In other cases, a data set is ready for processing when it is first made available from an front end processing circuit. Where a data set is ready (block 505), it is determined whether a data detector circuit is available to process the data set (block 510).

Where the data detector circuit is available for processing (block 510), the data set is accessed by the available data detector circuit (block 515). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 518). The data detection is performed at a variable processing rate that is more fully described below. Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 520). The derivative of the detected output may be, for example, an interleaved or shuffled version of the detected output.

In parallel to the previously described data detection process, it is determined whether a data decoder circuit is available (block 506). The data decoder circuit may be, for example, a low density data decoder circuit as are known in the art. Where the data decoder circuit is available (block 506), selection of one of a number of parity check matrices for used in relation to the data decoding is performed (block 556). This process of selecting a parity check matrix is discussed more fully below in relation to FIG. 5*b*. A previously stored derivative of a detected output is accessed from the central memory and used as a received codeword (block 511). A data decode algorithm is applied to the received codeword to yield a decoded output (block 516). The data decode algorithm is performed using the previously selected parity check matrix. Where a previous local iteration has been performed on the received codeword, the results of the previous local iteration (i.e., a previous decoded output) are used to guide application of the decode algorithm. It is then determined whether the decoded output converged (e.g., resulted in the originally written data as indicated by the lack of remaining unsatisfied checks) (block 521). Where the decoded output converged (block 521), it is provided as a decoded output (block 526).

Alternatively, where the decoded output failed to converge (e.g., errors remain) (block 521), it is determined whether another local iteration is desired (block 531). In some cases, as a default seven local iterations are allowed per each global iteration. As more fully discussed below, this number of local iterations may be reduced where an excessive power condition is identified. Based upon the disclosure provided herein, one of ordinary skill in the art will recognize another default number of local iterations that may be used in relation to different embodiments of the present invention. Where another local iteration is desired (block 531), selection of one of a number of parity check matrices for used in relation to the data decoding is performed (block 551). This process of selecting a parity check matrix is discussed more fully below in relation to FIG. 5*c*. Once the selection process is completed, the processes of blocks 506-531 are repeated for the codeword.

Alternatively, where another local iteration is not desired (block 531), it is determined whether another global iteration is allowed (block 536). As a default, another global iteration is allowed where there is sufficient available space in the central memory and an output memory reordering queue to allow another pass through processing the currently processing codeword. The amount of available space in the central memory and an output memory reordering queue is a function of how many iterations are being used by concurrently processing codewords to converge. For more detail on the output queue time limitation see, for example, U.S. patent application Ser. No. 12/114,462 entitled "Systems and Methods for Queue Based Data Detection and Decoding", and filed May 8, 2008 by Yang et al. The entirety of the aforementioned reference is incorporated herein by reference for all purposes. Thus, the amount of time that a codeword may continue processing through global iterations is a function of the availability of central memory and an output memory reordering queue. By limiting the number of global iterations that may be performed, the amount of time a codeword may continue processing through global iterations can be reduced.

Where another global iteration is allowed (block 536), a derivative of the decoded output is stored to the central memory (block 536). The derivative of the decoded output being stored to the central memory triggers the data set ready query of block 505 to begin the data detection process. Alternatively, where another global iteration is not allowed (block 536), a failure to converge is indicated (block 541), and the current decoded output is provided (block 526).

Figure 5B:
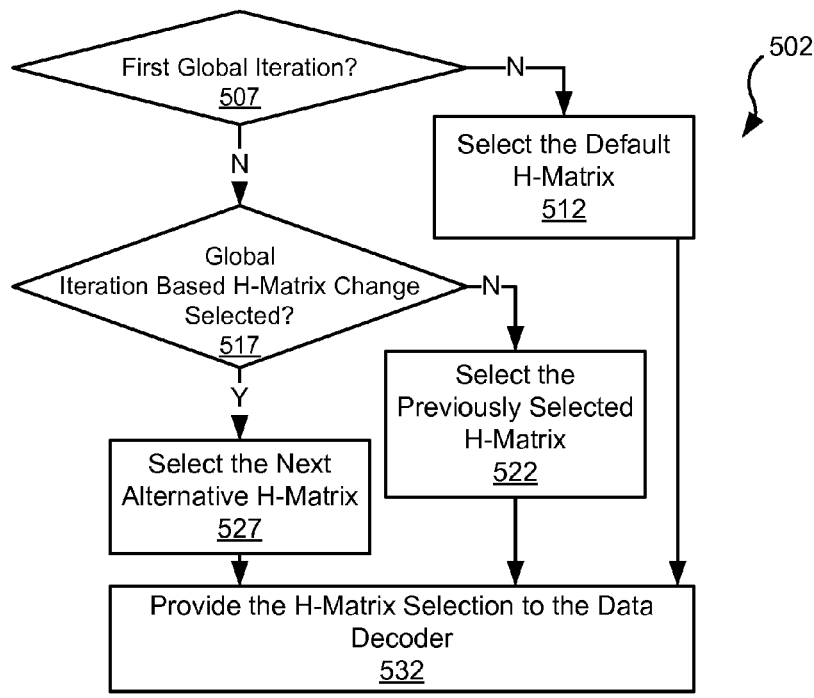
FIG. 5b is a flow diagram showing a method for selection between multiple parity matrices used but the data decoder of FIG. 5a in accordance with some embodiments of the present invention.

Turning to FIG. 5*b*, a flow diagram 502 shows a method for performing selection based upon a global iteration as done in block 556 of FIG. 5*a* is described. Following flow diagram 502, it is determined whether the current global iteration is the first global iteration for the currently processing codeword (block 507). Where it is the first global iteration (block 507), the default H-matrix is selected for use in applying the data decode algorithm of block 516 (block 512). Alternatively, where it is not the first global iteration (block 507), it is determined whether the selection of a parity check matrix is to be based on global iterations (block 517). Where the selection of the parity check matrix is not based on global iterations (block 517), the previously selected parity check matrix is maintained (block 522). This previously selected parity check matrix may either be the default parity check matrix selected in block 512 or may be another parity check matrix selected as described below in relation to block 523 of FIG. 5*c*. Alternatively, where the selection of the parity check matrix is based on global iterations (block 517), the next alternative H-matrix is selected for use in applying the data decode algorithm of block 516 (block 527). This may be done on each new global iteration, or after a defined number of global iterations. Ultimately, the selected H-matrix is provided for use by the decode algorithm (block 532). At this juncture, processing returns to block 511 of FIG. 5*a*.

Figure 5C:
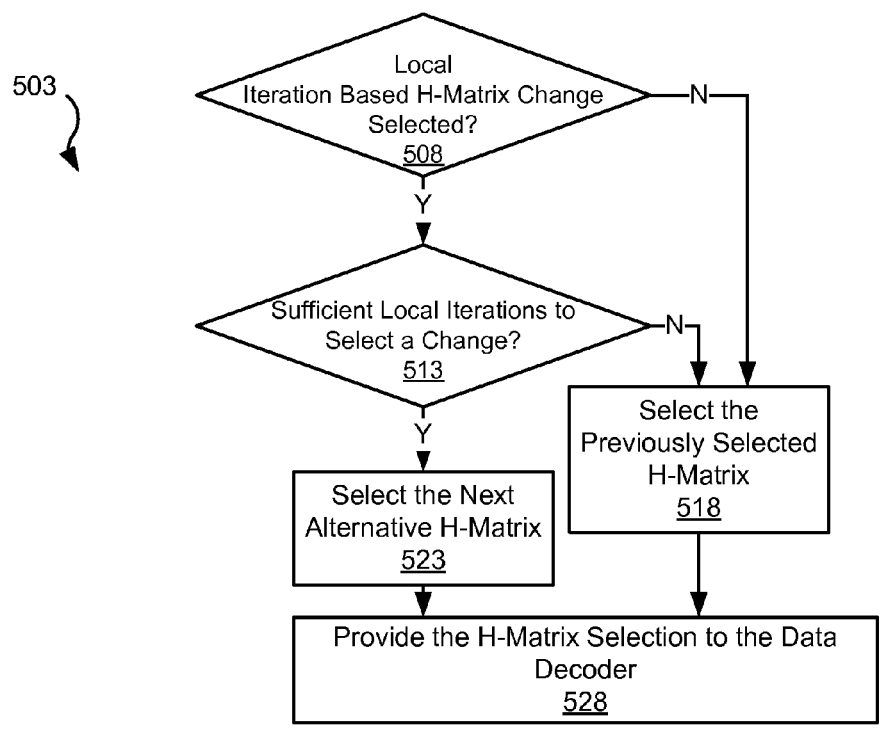
FIG. 5c is a flow diagram showing a method for performing selection based upon a local iteration as done in FIG. 5a in accordance with some embodiments of the present invention.

Turning to FIG. 5*c*, a flow diagram 503 shows a method for performing selection based upon a local iteration as done in block 551 of FIG. 5*a* is described. Following flow diagram 503, it is determined whether the selection of a parity check matrix is to be based on local iterations (block 508). Where the selection of the parity check matrix is not based on local iterations (block 508), the previously selected parity check matrix is maintained (block 518). This previously selected parity check matrix may either be the default parity check matrix selected in block 512 of FIG. 5*b* or may be another parity check matrix selected as selected by block 527 of FIG. 5b. Alternatively, where the selection of the parity check matrix is based on local iterations (block 508), the next alternative H-matrix is selected for use in applying the data decode algorithm of block 516 (block 523). This may be done on each new local iteration, or after a defined number of local iterations. Ultimately, the selected H-matrix is provided for use by the decode algorithm (block 528). At this juncture, processing returns to block 516 of FIG. 5a.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for power governance. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data decoder circuit operable to apply a data decode algorithm to a decoder input using a selected parity check matrix to yield a decoder output; and
   a matrix select control circuit operable to select one of a first parity check matrix and a second parity check matrix as the selected parity check matrix, wherein selection of the selected parity check matrix by the matrix select control circuit is based at least in part on a criteria selected from a group consisting of: a number of local iterations through the data decoder circuit, and a number of global iterations through the data decoder circuit and a data detector circuit.

2. The data processing system of claim 1, wherein the data decoder circuit is operable to repeat application of the data decode algorithm to the decoder input over the number of local iterations.

3. The data processing system of claim 2, wherein during a first local iteration the first parity check matrix is selected, and wherein during a second local iteration the matrix select control circuit selects the second parity check matrix as the selected parity check matrix.

4. The data processing system of claim 3, wherein the data decoder output includes at least one unsatisfied check and at least one satisfied check, and wherein the decoder output corresponding to the at least one unsatisfied check is erased and the decoder output corresponding to the at least one unsatisfied check is used to guide a subsequent local iteration of the data decode algorithm.

5. The data processing system of claim 1, wherein the data detector circuit is operable to apply a data detection algorithm to a data input to yield a detected output, wherein the decoder input is derived from the detected output, and wherein processing through both the data detector circuit and the data decoder circuit is repeatable over a number of global iterations.

6. The data processing system of claim 5, wherein the data detector circuit is selected from a group consisting of: a Viterbi algorithm data detector circuit, and a maximum a posteriori data detector circuit.

7. The data processing system of claim 5, wherein the data decoder output includes at least one unsatisfied check and at least one satisfied check, and wherein the decoder output corresponding to the at least one unsatisfied check is erased and the decoder output corresponding to the at least one unsatisfied check is used to guide a subsequent global iteration of the data decode algorithm.

8. The data processing system of claim 1, wherein the data decoder circuit is a low density parity check decoder circuit.

9. The data processing system of claim 1, wherein the data processing system is implemented as an integrated circuit.

10. The data processing system of claim 1, wherein the data processing system is incorporated in a device selected from a group consisting of: a storage device, and a data communication device.

11. A method for data processing, the method comprising:
    providing a data decoder circuit;
    selecting a first parity check matrix as a selected parity check matrix;
    applying a data decode algorithm by the data decoder circuit to a decoder input using the selected parity check matrix to yield a first decoder output;
    determining that the decoder output has at least one unsatisfied check;
    selecting a second parity check matrix as the selected parity check matrix based at least in part on the determination that the decoder output has at least one unsatisfied check; and
    reapplying the data decode algorithm by the data decoder circuit to the decoder input using the selected parity check matrix to yield a second decoder output.

12. The method of claim 11, wherein a portion of the first decoder output is used to guide application of the data decode algorithm to yield the second decoder output.

13. The method of claim 11, wherein the first decoder output includes at least one unsatisfied check and at least one satisfied check, and wherein a portion of the first decoder output includes the at least one satisfied check and excludes the at least one unsatisfied check.

14. The method of claim 11, wherein the method further comprises:
    providing a data detector circuit;
    applying a data detection algorithm by the data detector circuit to a data input to yield a detected output, wherein the decoder input is derived from the detected output, and wherein processing the data input through both the data detector circuit and the data decoder circuit is repeated for a number of global iterations; and
    wherein selecting the second parity check matrix as the selected parity check matrix is based at least in part on the number of global iterations.

15. The method of claim 14, wherein the first decoder output includes at least one unsatisfied check and at least one satisfied check, and wherein a portion of the first decoder output includes the at least one satisfied check and excludes the at least one unsatisfied check.

16. The method of claim 14, wherein the data detector circuit is selected from a group consisting of: a Viterbi algorithm data detector circuit, and a maximum a posteriori data detector circuit.

17. The method of claim 11, wherein the data decoder circuit is a low density parity check decoder circuit.

18. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data decoder circuit operable to apply a data decode algorithm to a decoder input that is derived from the data set using a selected parity check matrix to yield a decoder output; and
a matrix select control circuit operable to select one of a first parity check matrix and a second parity check matrix as the selected parity check matrix, wherein selection of the selected parity check matrix by the matrix select control circuit is based at least in part on a criteria selected from a group consisting of: a number of local iterations through the data decoder circuit, and a number of global iterations through the data decoder circuit and a data detector circuit.

19. The storage device of claim 18, wherein the read channel circuit further comprises:
the data detector circuit operable to apply a data detection algorithm to a data input to yield a detected output, wherein the decoder input is derived from the detected output, wherein processing through both the data detector circuit and the data decoder circuit is repeatable over a number of global iterations.

* * * * *